United States Patent
Ye et al.

(10) Patent No.: US 10,340,268 B2
(45) Date of Patent: Jul. 2, 2019

(54) FINFET STRUCTURE AND FABRICATING METHOD OF GATE STRUCTURE

(71) Applicant: UNITED MICROELECTRONICS CORP., Hsin-Chu (TW)

(72) Inventors: Yi-Liang Ye, Kaohsiung (TW); Kuang-Hsiu Chen, Tainan (TW); Chun-Wei Yu, Tainan (TW); Chueh-Yang Liu, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/284,552

(22) Filed: Oct. 4, 2016

(65) Prior Publication Data

US 2018/0096995 A1  Apr. 5, 2018

(51) Int. Cl.
*H01L 29/51* (2006.01)
*H01L 27/088* (2006.01)
*H01L 21/8234* (2006.01)

(52) U.S. Cl.
CPC .. *H01L 27/0886* (2013.01); *H01L 21/823431* (2013.01); *H01L 21/823462* (2013.01); *H01L 29/517* (2013.01)

(58) Field of Classification Search
CPC ..... H01L 21/823857; H01L 21/823462; H01L 21/823807; H01L 21/823814; H01L 21/823835; H01L 21/823842; H01L 21/823864; H01L 22/14; H01L 22/20; H01L 27/0883; H01L 27/092; H01L 29/165; H01L 29/6653
See application file for complete search history.

(56) References Cited

U.S. PATENT DOCUMENTS

| 9,123,743 | B2 | 9/2015 | Lin | |
|---|---|---|---|---|
| 2005/0112817 | A1* | 5/2005 | Cheng | H01L 21/823807 438/219 |
| 2006/0275975 | A1* | 12/2006 | Yeh | H01L 21/823842 438/216 |
| 2014/0061814 | A1* | 3/2014 | Kim | H01L 21/823857 257/369 |
| 2018/0247956 | A1* | 8/2018 | Stamper | H01L 29/0649 |

* cited by examiner

*Primary Examiner* — Edward Chin
(74) *Attorney, Agent, or Firm* — Winston Hsu

(57) ABSTRACT

A method of forming a gate structure on a fin structure includes the steps of providing a fin structure covered by a first silicon oxide layer, a silicon nitride layer, a gate material and a cap material in sequence, wherein the silicon nitride layer contacts the first silicon oxide layer. Later, the cap material is patterned to form a first cap layer and the gate material is patterned to form a first gate electrode by taking the silicon nitride layer as an etching stop layer. Then, the silicon nitride layer not covered by the first gate electrode is removed to expose part of the first silicon oxide layer. Finally, a first dielectric layer is formed to conformally cover the first silicon oxide layer, the first gate electrode and the first cap layer.

6 Claims, 5 Drawing Sheets

FINFET STRUCTURE AND FABRICATING METHOD OF GATE STRUCTURE

BACKGROUND OF THE INVENTION

1. Field of the Invention

The present invention relates to a method of fabricating a gate structure, and more particularly to a method of fabricating a gate structure by using an additional silicon nitride layer.

2. Description of the Prior Art

In recent years, the semiconductor industry has experienced exponential growth, particularly in the pursuit of higher device density and performance with lower cost. A classical planar transistor cannot achieve such goals, however, due to physical constraints.

Accordingly, various non-planar transistors, such as fin-like field-effect transistors (FinFETs), have been introduced to replace planar transistors. Although existing FinFETs and methods of fabricating FinFETs have been adequate for their intended purposes, they have not been entirely satisfactory in all respects. With high demand for scaling down the FinFET size, manufacturing methods must be continuously improved to obtain a more satisfactory FinFET structure.

SUMMARY OF THE INVENTION

According to a preferred embodiment of the present invention, a FinFET structure includes a fin structure and a first gate structure disposed on the fin structure. The first gate structure includes a first gate electrode, a first silicon oxide layer contacting the fin structure, a silicon nitride layer contacting the silicon oxide layer and a first gate dielectric layer disposed between the first gate electrode and the silicon nitride layer. The FinFET structure further includes a second gate structure disposed on the fin structure. The second gate structure includes a second gate electrode, a second silicon oxide layer and a second gate dielectric layer between the second gate electrode and the second silicon oxide layer. The second gate dielectric layer does not cover the silicon nitride layer and the first silicon oxide layer. The FinFET structure further includes first source/drain doped regions disposed in the fin structure at two sides of the first gate electrode and second source/drain doped regions disposed in the fin structure at two sides of the second gate electrode.

According to another preferred embodiment of the present invention, a method of forming a gate structure on a fin structure includes the steps of providing a fin structure covered by a first silicon oxide layer, a silicon nitride layer, a gate material and a cap material in sequence, wherein the silicon nitride layer contacts the first silicon oxide layer. Later, the cap material is patterned to form a first cap layer and the gate material is patterned to form a first gate electrode by taking the silicon nitride layer as an etching stop layer. Then, the silicon nitride layer not covered by the first gate electrode is removed to expose part of the first silicon oxide layer. Finally, a first dielectric layer is formed to conformally cover the first silicon oxide layer, the first gate electrode and the first cap layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 depict a method of forming a gate structure on a fin structure according to a preferred embodiment of the present invention, wherein:

FIG. 1 is a fabricating stage of providing a fin structure;
FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
FIG. 6 is a fabricating stage following FIG. 5;
FIG. 7 is a fabricating stage following FIG. 6;
FIG. 8 is a fabricating stage following FIG. 7;
FIG. 9 is a three dimensional diagram of FinFET structures.

DETAILED DESCRIPTION

Figure 1:
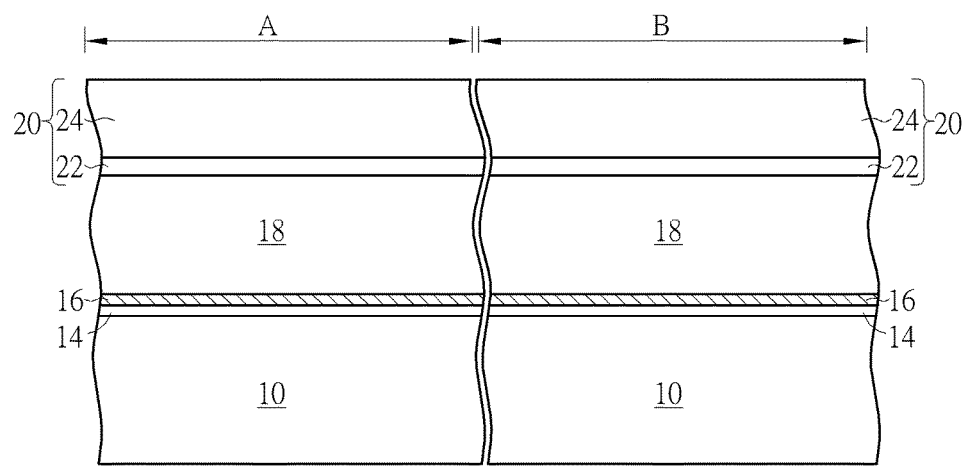
Figure 7:
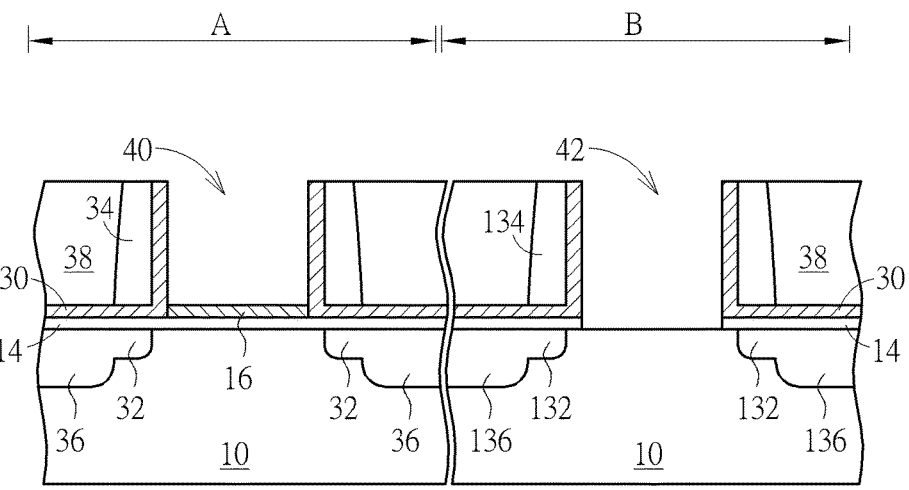
Figure 8:
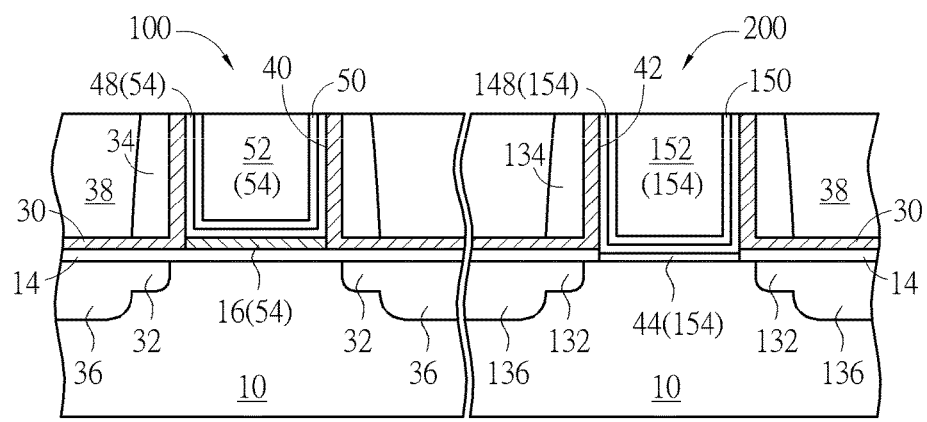
Figure 9:
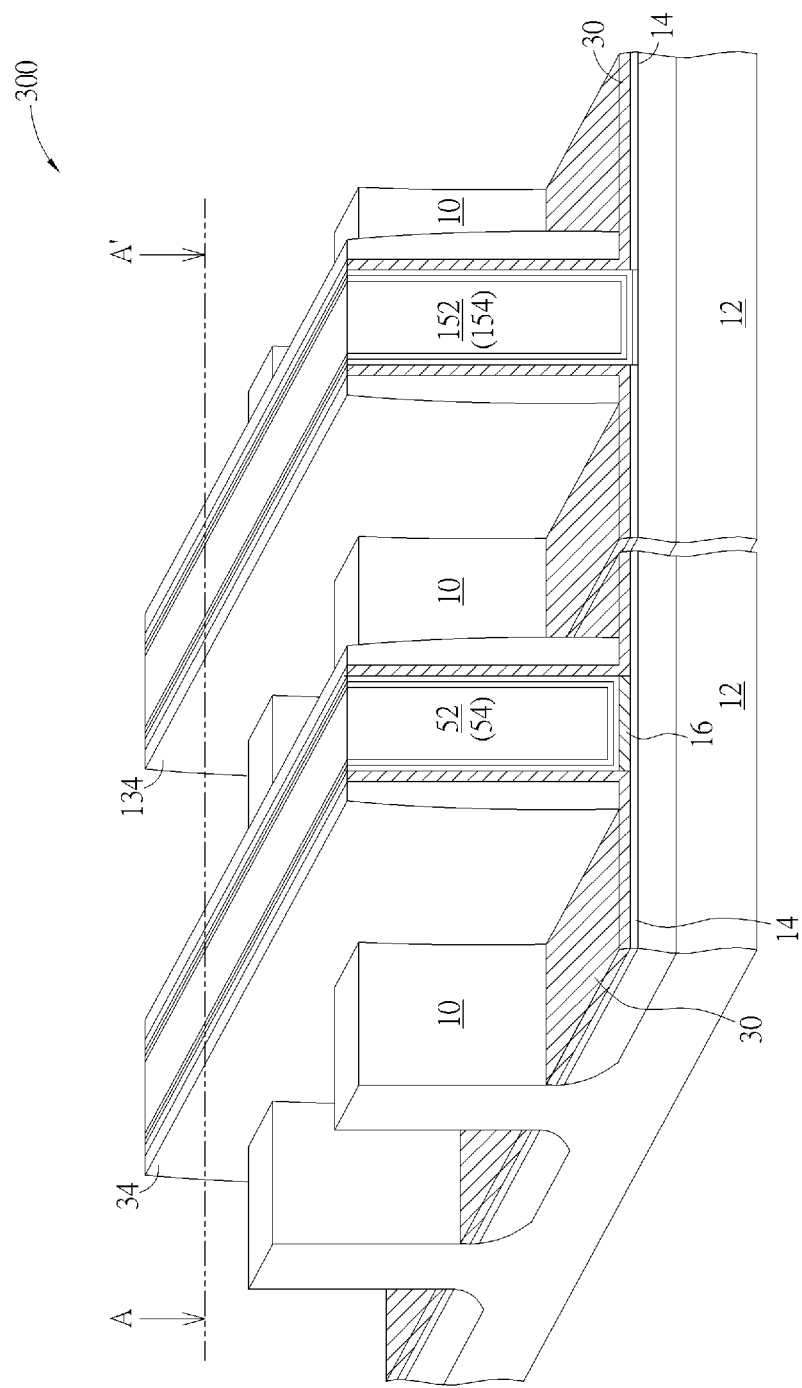

FIG. 1 to FIG. 9 depict a method of forming a gate structure on a fin structure according to a preferred embodiment of the present invention, wherein FIG. 9 is a three dimensional diagram of FinFET structures fabricated by the method provided in the present invention. As shown in FIG. 1, at least one fin structure 10 is provided. The fin structure 10 protrudes from a substrate 12. Refer to FIG. 9 for the position of the substrate 12. Referring back to FIG. 1, the number of the fin structure 10 can be adjusted based on different requirements. The fin structure 10 includes a first region A and a second region B. The operational voltage of a device within the first region A is higher than the operational voltage of a device within the second region B.

A first silicon oxide layer 14, a silicon nitride layer 16, a gate material 18, and a cap material 20 are formed to cover the first region A and the second region B on the fin structure 10 from bottom to top. The silicon nitride layer 16 contacts the first silicon oxide layer 14. The first silicon oxide layer 14 may be formed by an in situ steam generation process. The gate material 18 may be polysilicon, amorphous silicon, silicide or other materials which can serve as a dummy gate. The cap material 20 may be a stacked layer such as a silicon nitride layer 22 and a silicon oxide layer 24. The first silicon oxide layer 14 is silicon oxide. The silicon nitride layer 16 is silicon nitride.

Figure 2:
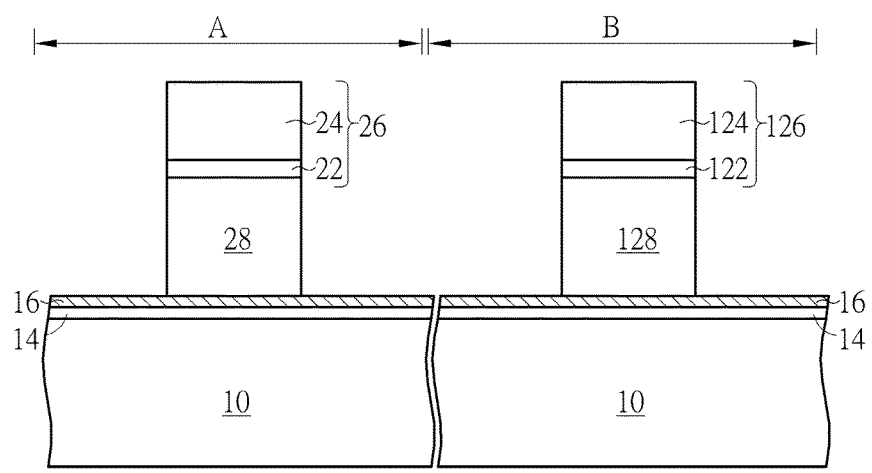

As shown in FIG. 2, the cap material 20 and the gate material 18 are patterned by taking the silicon nitride layer 16 as an etching stop layer to form a first cap layer 26 and a first gate electrode 28 within the first region A, and to form a second cap layer 126 and a second gate electrode 128 within the second region B. In detail, the first cap layer 26 and the second cap layer 126 are formed by etching the cap material 20. The first gate electrode 28 and the second gate electrode 128 are formed by etching the gate material 18. Because the silicon nitride layer 16 serves as an etching stop layer, the first silicon oxide layer 14 under the silicon nitride layer 16 is protected by the silicon nitride layer 16 while etching the cap material 20 and the gate material 18. The surface of the first silicon oxide layer 14 will therefore not be damaged by the etchant when etching the cap material 20 and the gate material 18.

Figure 3:
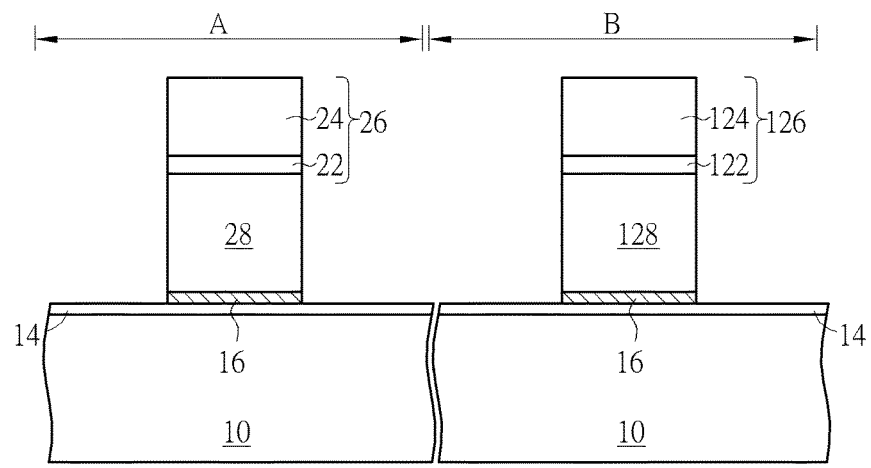
Figure 4:
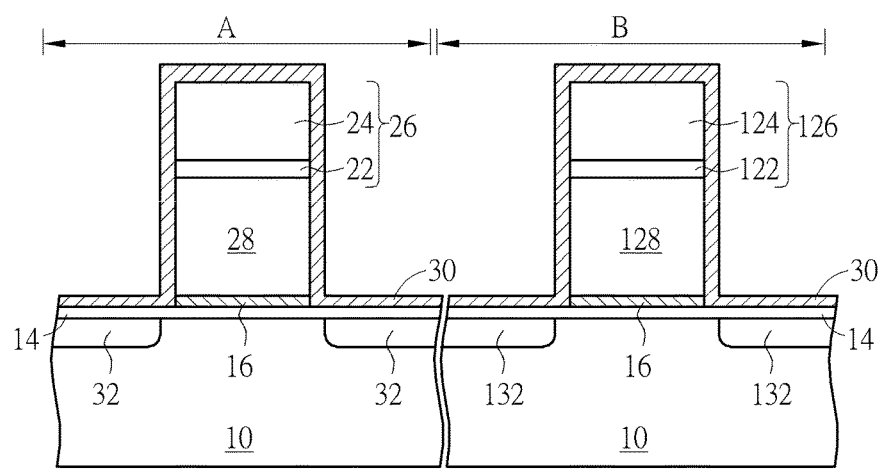

As shown in FIG. 3, the silicon nitride layer 16 not covered by the first gate electrode 28 and the second gate electrode 128 is removed to expose part of the first silicon oxide layer 14. The silicon nitride layer 16 can be removed by a clean process such as a clean process using phosphoric acid as a clean solution. As shown in FIG. 4, a first dielectric layer 30 is formed to conformally cover the first silicon oxide layer 14, the first gate electrode 28, the second gate electrode 128, the first cap layer 26 and the second cap layer 126. The first dielectric layer 30 is preferably silicon carbon nitride. Then, at least one first implantation process is performed to implant dopants into the fin structure 10 to form first lightly doped regions 32 in the fin structure 10 at two sides of the first gate electrode 28 and second lightly doped regions 132 in the fin structure 10 at two sides of the second gate electrode 128. The conductive type of the first lightly doped regions 32 and the second lightly doped regions 132 may be the same or different.

The first lightly doped regions 32 and the second lightly doped regions 132 can be formed simultaneously if the first lightly doped regions 32 and the second lightly doped regions 132 are of the same conductive type. If the first lightly doped regions 32 and the second lightly doped regions 132 are different conductive types, they should be formed by two separate implantation processes. The dopants can be P-type dopants or N-type dopants. The conductive type of the first lightly doped regions 32 and the second lightly doped regions 132 may be the same or different.

Figure 5:
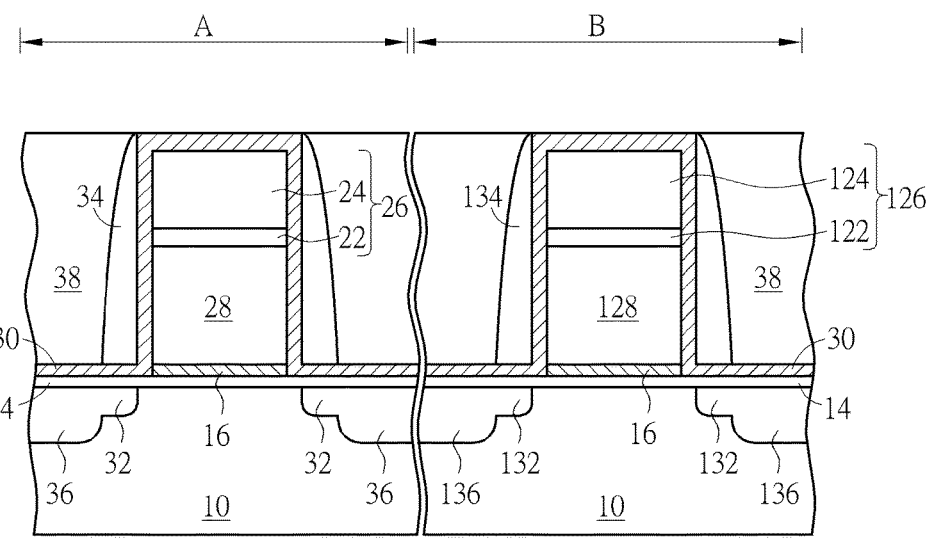

As shown in FIG. 5, a spacer 34 and a spacer 134 are formed to respectively surround the first gate electrode 28 and the second gate electrode 128. Later, at least one second implantation process is performed to implant dopants into the fin structure 10 to form first source/drain doped regions 36 in the fin structure 10 at two sides of the first gate electrode 28 and second source/drain doped regions 136 in the fin structure 10 at two sides of the second gate electrode 128. The conductive type of the first source/drain doped regions 36 and the second source/drain doped regions 136 may be the same or different. The first source/drain doped regions 36 and the second source/drain doped regions 136 can be formed simultaneously if the first source/drain doped regions 36 and the second source/drain doped regions 136 are of the same conductive type. If the first source/drain doped regions 36 and the second source/drain doped regions 136 are different conductive types, they should be formed by two separate implantation processes. The dopants can be P-type dopants or N-type dopants. Then, a second dielectric layer 38 is formed blankly to cover the spacer 34, the spacer 134, the first dielectric layer 30, the first cap layer 26, and the second cap layer 126. Subsequently, the second dielectric layer 38 is planarized to be aligned with the first dielectric layer 30 on the top of the first cap layer 26.

Figure 6:
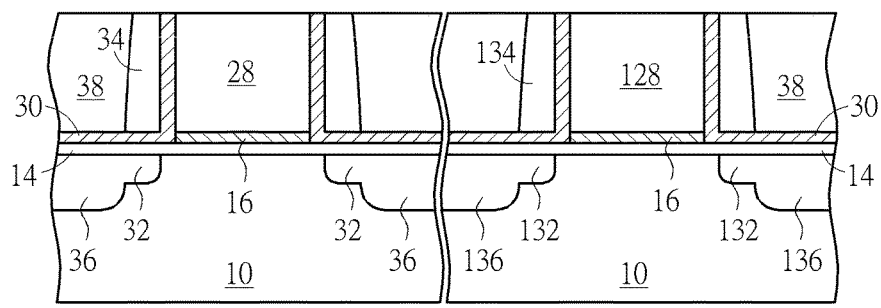

As shown in FIG. 6, part of the first dielectric layer 30, part of the spacers 34 sand 134, part of the second dielectric layer 38, the entire first cap layer 26, and the entire second cap layer 126 are removed to expose the first gate electrode 28 and the second gate electrode 128. As shown in FIG. 7, the first gate electrode 28 and the second gate electrode 128 are removed simultaneously. A first trench 40 is formed after removing the first gate electrode 28. Later, the silicon nitride layer 16 and the first silicon oxide layer 14 (which originally were directly under the second gate electrode 128) are removed. A second trench 42 is formed after removing the second gate electrode 128, the silicon nitride layer 16 under the second gate electrode 128, and the first silicon oxide layer 14 under the second gate electrode 128. At this point, part of the fin structure 10 in the second region B is exposed.

In detail, the first trench 40 is defined by the silicon nitride layer 16 and the first dielectric layer 30 in the first region A. The second trench 42 is defined by the first dielectric layer 30, and the fin structure 10 in the second region B. It is noteworthy that the first silicon oxide layer 14 and the silicon nitride layer 16 which originally were directly under the first gate electrode 28 are remained.

As shown in FIG. 8, a second silicon oxide layer 44 is formed on the bottom of the second trench 42. The second silicon oxide layer 44 can be formed by a chemical deposition process, an oxidation process or anatomic layer deposition process. The second silicon oxide layer 44 is silicon oxide. After that, a first gate dielectric layer 48 such as a first high-k dielectric material is formed at the sidewalls and the bottom of the first trench 40. A second gate dielectric layer 148 such as a second high-k dielectric material is formed on the sidewalls of the second trench 42, and on the second silicon oxide layer 44. The first gate dielectric layer 48 in the first trench 40 forms a U-shape. The second gate dielectric layer 148 in the second trench forms another U-shape. The first high-k dielectric material may be $Al_2O_3$, $ZrO_2$, barium strontium titanate (BST), lead zirconate titanate (PZT), $ZrSiO_2$, $HfSiO_2$, HfSiON, $TaO_2$, or the like. The second high-k dielectric material may $Al_2O_3$, $ZrO_2$, barium strontium titanate (BST), lead zirconate titanate (PZT), $ZrSiO_2$, $HfSiO_2$, HfSiON, $TaO_2$, or the like. The first high-k dielectric material and the second high-k dielectric material may be made of the same material or different materials. After that, a first work function layer 50 is formed in the first trench 40. The first work function layer 50 may be TiN, TaN or other metal nitride adjusting layer. The second work function layer 150 may be TiN, TaN or other metal nitride adjusting layer. A second work function layer 150 is formed in the second trench 42. The first work function layer 50 and the second work function layer 150 may be made of the same material or different materials. Later, a first metal gate electrode 52 fills in the first trench 40 and a second metal gate electrode 152 fills in the second trench 42. The first metal gate electrode 52 may be copper, aluminum, titanium, molybdenum, tantalum, tungsten or other metals. The second metal gate electrode 152 may be copper, aluminum, titanium, molybdenum, tantalum, tungsten or other metals. At this point, a FinFET 100 and a FinFET 200 are completed. The first metal gate electrode 52, the first silicon oxide layer 14 under the first metal gate electrode 52, the silicon nitride layer 16 and the first gate dielectric layer 48 serve as a first gate structure 54. The second metal gate electrode 152, the second silicon oxide layer 44 and the second gate dielectric layer 148 serve as a second gate structure 154.

FIG. 9 depicts a three dimensional diagram of FinFET structures. FIG. 8 depicts a sectional view taken along line AA' in FIG. 9. As shown in FIG. 8 and FIG. 9, FinFET structures 300 include a FinFET 100 and a FinFET 200.

The FinFET 100 includes a fin structure 10, a first gate structure 54 disposed on the fin structure 10, first source/drain doped regions 36 disposed in the fin structure 10 at two sides of the first gate structure 54, and first lightly doped regions 32 disposed in the fin structure 10 at two sides of the first gate structure 54. The first gate structure 54 includes a first metal gate electrode 52, a first silicon oxide layer 14 contacting the fin structure 10, a silicon nitride layer 16 contacting the silicon oxide layer 14 and a first gate dielectric layer 48 disposed between the first gate electrode 52 and the silicon nitride layer 16.

The FinFET 200 includes the fin structure 10, a second gate structure 154 disposed on the fin structure 10, second source/drain doped regions 136 disposed in the fin structure 10 at two sides of the second gate structure 154, and second lightly doped regions 132 disposed in the fin structure 10 at two sides of the second gate structure 154. The second gate structure 154 includes a second metal gate electrode 152, a second silicon oxide layer 44 contacting the fin structure 10, and a second gate dielectric layer 148 disposed between the second metal gate electrode 152 and the second silicon oxide layer 44. It is noteworthy that the second gate dielectric layer 148 does not cover the silicon nitride layer 16 and the first silicon oxide layer 14, i.e. the second gate structure 154 does not include the silicon nitride layer 16 and the first silicon oxide layer 14. The first gate structure 54 includes the silicon nitride layer 16 and the first silicon oxide layer 14. Furthermore, the first silicon oxide layer 14 is directly under the spacer 134 and the spacer 34. The thickness of the silicon nitride layer 16 is preferably 10 to 30 angstroms. The thickness of the first silicon oxide layer 14 is preferably 5 to 40 angstroms. The first silicon oxide layer 14 is silicon oxide. The silicon nitride layer 16 is silicon nitride. A first dielectric layer 30 such as a silicon carbon nitride surrounds the first gate structure 54 and the second gate structure 154.

The first gate dielectric layer 48 may be a first high-k dielectric material, and the first high-k dielectric material is U-shaped. The first high-k dielectric material may be $Al_2O_3$, $ZrO_2$, barium strontium titanate (BST), lead zirconate titanate (PZT), $ZrSiO_2$, $HfSiO_2$, HfSiON, $TaO_2$, or the like. The second gate dielectric layer 148 may be a second high-k dielectric material, and the second high-k dielectric material is also U-shaped. The second high-k dielectric material may be $Al_2O_3$, $ZrO_2$, barium strontium titanate (BST), lead zirconate titanate (PZT), $ZrSiO_2$, $HfSiO_2$, HfSiON, $TaO_2$, or the like. The first gate dielectric layer 48 and the second gate dielectric layer 148 may be made of the same material or different materials.

The fin structure 10 further includes a first region A and a second region B. The operational voltage of a device within the first region A is higher than the operational voltage of a device within the second region B. The FinFET 100 is disposed within the first region A, and the FinFET 200 is disposed within the second region B. The FinFET 100 may serve as a high voltage device such as an input/output (IO) transistor, and the FinFET 200 may serve as a low voltage device such as a core transistor.

Conventionally, the cap material 20 and the gate material 18 are patterned by using the first silicon oxide layer 14 as an etching stop layer. The quality of the first silicon oxide layer 14 will be damaged after the patterning process, however, and the etchant will flow into the damaged part of the first silicon oxide layer 14 to harm the bottom corner of the gate electrode formed by the gate material 18. The present invention utilizes a silicon nitride layer 16 as an etching stop layer while patterning the cap material 20 and the gate material 18. In this way, the first silicon oxide layer 14 under the silicon nitride layer 16 can be protected by the silicon nitride layer 16 during the patterning process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A FinFET structure, comprising
a fin structure;
a first gate structure disposed on the fin structure, wherein the first gate structure comprises:
a first gate electrode;
a first silicon oxide layer contacting the fin structure and disposed directly under the first gate electrode, wherein the first silicon oxide layer is an integral monolithic structure;
a silicon nitride layer contacting the silicon oxide layer;
a first gate dielectric layer disposed between the first gate electrode and the silicon nitride layer; and
a dielectric layer disposed at two sides of the first gate electrode;
a second gate structure disposed on the fin structure, wherein the second gate structure comprises:
a second gate electrode;
a second silicon oxide layer; and
a second gate dielectric layer between the second gate electrode and the second silicon oxide layer, wherein the second gate dielectric layer does not cover the silicon nitride layer and the first silicon oxide layer;
first source/drain doped regions disposed in the fin structure at two sides of the first gate electrode; and
second source/drain doped regions disposed in the fin structure at two sides of the second gate electrode, wherein the first silicon oxide layer extends to contact the first source/drain doped regions and the second source/drain doped regions, and a portion of the first silicon oxide layer contacts the first source/drain doped regions, the dielectric layer contacts the portion of the first silicon oxide layer.

2. The FinFET structure of claim 1, further comprising:
a silicon carbon nitride layer surrounding the first gate structure and the second gate structure.

3. The FinFET structure of claim 1, wherein the first gate electrode is metal and the second gate electrode is metal.

4. The FinFET structure of claim 1, wherein the first gate dielectric layer comprises a first high-k dielectric material and is U-shaped.

5. The FinFET structure of claim 1, wherein the second gate dielectric layer comprises a second high-k dielectric material and is U-shaped.

6. The FinFET structure of claim 1, wherein a topmost surface of the first silicon oxide layer is lower than every part of the first gate electrode.

* * * * *